United States Patent
Park et al.

(10) Patent No.: US 7,795,123 B2
(45) Date of Patent: Sep. 14, 2010

(54) METHOD OF FORMING GATE ELECTRODE

(75) Inventors: Eun Shil Park, Namyangju-Si (KR); Kwon Hong, Seongnam-si (KR); Jae Hong Kim, Seongnam-si (KR); Jae Hyoung Koo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/345,832

(22) Filed: Dec. 30, 2008

(65) Prior Publication Data

US 2009/0181528 A1 Jul. 16, 2009

(30) Foreign Application Priority Data

Jan. 14, 2008 (KR) ...................... 10-2008-0003896

(51) Int. Cl.
*H01L 21/3205* (2006.01)
*H01L 21/4763* (2006.01)

(52) U.S. Cl. .......... 438/585; 257/E21.09; 257/E21.294; 438/587

(58) Field of Classification Search ................. 438/197, 438/255, 542, 585, 587; 257/E21.09, E21.294, 257/E21.197
See application file for complete search history.

(56) References Cited

U.S. PATENT DOCUMENTS

| | | | | | |
|---|---|---|---|---|---|
| 5,930,658 | A | * | 7/1999 | Ibok | 438/482 |
| 6,020,260 | A | * | 2/2000 | Gardner | 438/657 |
| 6,297,529 | B1 | * | 10/2001 | Imai | 257/318 |
| 7,067,382 | B2 | * | 6/2006 | Nakaoka et al. | 438/301 |
| 2005/0095766 | A1 | * | 5/2005 | Yang | 438/197 |
| 2007/0105305 | A1 | * | 5/2007 | Gu | 438/255 |
| 2008/0194087 | A1 | * | 8/2008 | Yu et al. | 438/542 |
| 2009/0181528 | A1 | * | 7/2009 | Park et al. | 438/585 |

FOREIGN PATENT DOCUMENTS

| | | |
|---|---|---|
| JP | 07-045608 A | 2/1995 |
| KR | 10-1999-0005819 | 1/1999 |
| KR | 10-2003-0089268 | 11/2003 |
| KR | 10-2005-0114402 A | 12/2005 |

\* cited by examiner

*Primary Examiner*—Walter L Lindsay, Jr.
(74) *Attorney, Agent, or Firm*—Marshall, Gerstein & Borun LLP

(57) ABSTRACT

The present invention discloses to a method of forming a gate electrode, the method according to the present invention comprises the steps of forming a lower amorphous silicon layer using silane ($SiH_4$) gas and nitrous oxide ($N_2O$) gas; forming an upper amorphous silicon layer on the lower amorphous silicon layer; and crystallizing the lower and upper amorphous silicon layers through a thermal process.

12 Claims, 2 Drawing Sheets

METHOD OF FORMING GATE ELECTRODE

CROSS-REFERENCE TO RELATED APPLICATION

This application claims priority from Korean Patent Application No. 10-2008-0003896, filed on Jan. 14, 2008, the contents of which are incorporated herein by reference in its entirety.

BACKGROUND OF THE INVENTION

The present invention relates to a method of forming a gate electrode, more particularly relates to a method of forming a gate electrode, being capable of oxidizing partially a lower amorphous silicon layer to form a lower polysilicon layer which is more uniform and denser than an upper polysilicon layer.

A gate of a semiconductor is formed by stacking a gate electrode on a gate oxide layer. In order to reduce a concentration of an impurity (for example, phosphorous (P)) on an interface between the gate electrode and the gate oxide layer, in general, the gate electrode is formed with a stack layer consisting of an undoped polysilicon layer and a doped polysilicon layer. At this time, a silicon thin layer, which is in amorphous state, is formed by utilizing silane ($SiH_4$) gas, and the amorphous silicon thin layer is crystallized to form a polysilicon layer through a subsequent thermal process. As a result, the undoped polysilicon layer is obtained. However, in a case where the amorphous silicon layer is crystallized to form the polysilicon layer through the subsequent thermal process, a polysilicon layer having a large grain size is formed.

In recent, as the semiconductor memory device becomes highly integrated, the area of the gate is reduced, there is a difference in the number of grains between the gates. As a result, boundaries of grains are irregularly distributed at the respective gates. During the process, however, a dopant of the polysilicon is diffused to an interface between the gate electrode and the gate oxide layer along the irregular boundary of the grain so that the gate oxide layer is deteriorated. In particular, the dopant is concentrated on a portion at which the grain boundary is in contact with the gate oxide layer so that a difference of electric field is generated. Accordingly, a characteristic of the device is lowered by a threshold voltage distribution characteristic difference between the gates caused by the difference of electric field.

SUMMARY OF THE INVENTION

An object of the present invention is to provide a method of forming a gate electrode, in which a polysilicon layer, which is in contact with a gate insulating layer and has a uniform and densed grain size, is formed to form a gate electrode in which boundaries of the grains being in contact with the gate insulating layer are regularly distributed, whereby a concentration of the dopant on an interface between the gate insulating layer and the gate electrode becomes uniform to improve a threshold voltage distribution characteristic between the gates.

The method of forming a gate electrode according to one embodiment of the present invention comprises the steps of forming a lower amorphous silicon layer using silane ($SiH_4$) gas and nitrous oxide ($N_2O$) gas; forming an upper amorphous silicon layer on the lower amorphous silicon layer; and crystallizing the lower and upper amorphous silicon layers through a thermal process.

Here, the lower polysilicon layer, which is crystallized after performing the thermal process, has the grain size which is more uniform and denser than that of the upper polysilicon layer due to a partial oxidation of the lower amorphous silicon layer caused by nitrous oxide ($N_2O$) gas.

The lower amorphous silicon layer is formed through a lower pressure chemical vapor deposition process. In this case, the lower pressure chemical vapor deposition process is performed at a temperature of 700 to 900° C. and a pressure of 0.5 to 2.0 Torr.

The upper amorphous silicon layer is formed through a lower pressure chemical vapor deposition process. In this case, the lower pressure chemical vapor deposition process is performed at a temperature of 500 to 650° C. and a pressure of 0.5 to 2.0 Torr and under an atmosphere of silane ($SiH_4$) gas and phosphine ($PH_3$) gas.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. Hereinafter, the preferred embodiments of the present invention will be explained in more detail with reference to the accompanying drawings. However, it should be understood that the embodiment of the present invention can be variously modified, a scope of the present invention is not limited to the embodiment described herein, and the embodiment is provided for explaining more completely the present invention to those skilled in the art.

FIG. 1A to FIG. 1D are sectional views of a device for illustrating a method of forming a gate electrode of a semiconductor device according to one embodiment of the present invention.

Figure 1A:
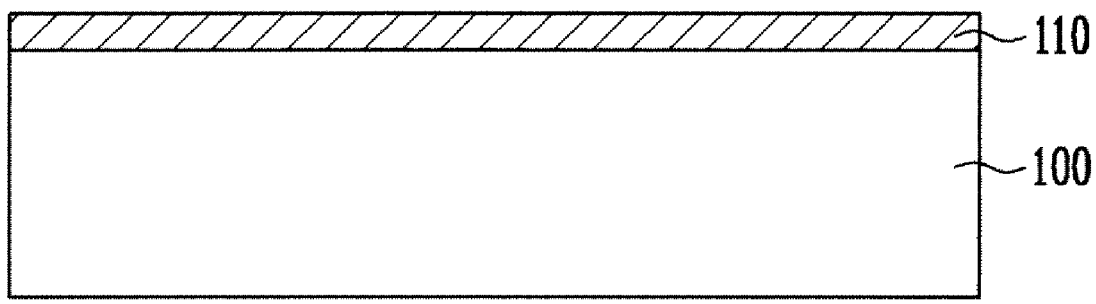
FIG. 1A to FIG. 1D are sectional views of a device for illustrating a method of forming a gate electrode of a semiconductor device according to one embodiment of the present invention.

Referring to FIG. 1A, a gate insulating layer 110 is formed on a semiconductor substrate 100. A silicon oxide ($SiO_2$) layer may be formed as the gate insulating layer 110, and an oxidation process may be performed for forming this silicon oxide layer. Preferably, the gate insulating layer 110 may be formed in a radical oxidation process performed at a temperature of 700° C. to 900° C. a pressure of 0.1 Torr to 0.5 Torr under an atmosphere of oxygen ($O_2$) and hydrogen ($H_2$) and utilizing a radical reaction. In the flash memory device, in the meantime, the gate insulating layer 110 acts as a tunnel insulating layer.

Figure 1B:
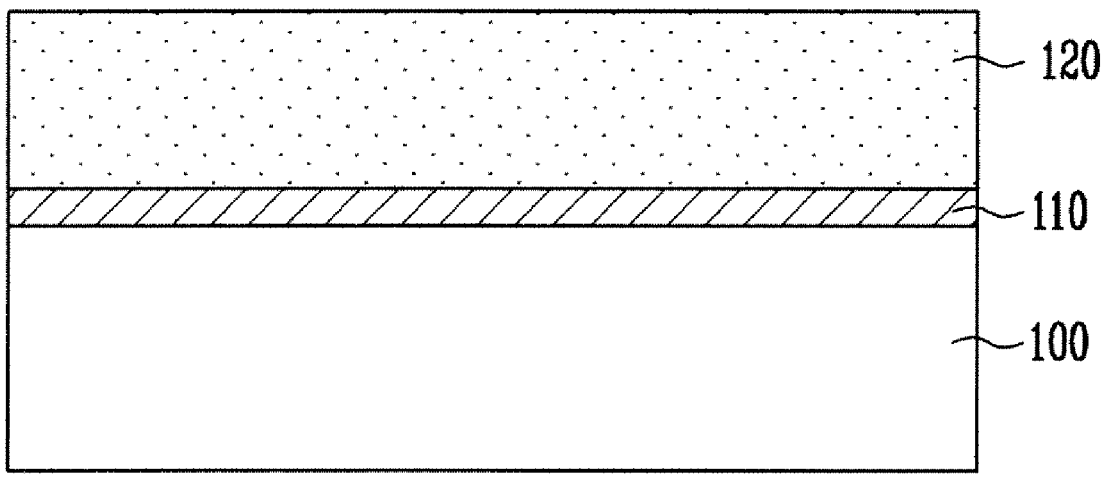

Referring to FIG. 1B, a lower amorphous silicon layer 120 is formed on the gate insulating layer 110. The lower amorphous silicon layer 120 acts as a lower layer of a gate electrode in a semiconductor device and acts as a lower layer of a floating gate in a flash memory device.

In order to lower a concentration of dopant (i.e., phosphorus (P)) on an interface between the gate insulating layer 110 and a gate electrode, it is preferable to form an undoped amorphous silicon layer as the above lower amorphous silicon layer 120.

In particular, in order to prevent a grain size of the layer from being increased and obtain the uniform and densed grain size when the amorphous silicon layer is crystallized to form a polysilicon layer during a subsequent high thermal process, the lower amorphous silicon layer 120 is formed through a low pressure chemical vapor deposition (LPCVD) process performed at a temperature of 500 to 650° C. and a pressure of 0.5 to 2.0 Torr and under an atmosphere of silane ($SiH_4$) gas and nitrous oxide ($N_2O$) gas.

At this time, due to a small quantity of nitrous oxide ($N_2O$) gas which is supplied along with silane ($SiH_4$) gas for forming the lower amorphous silicon layer 120, a partial oxidation is generated in the lower amorphous silicon layer 120. This partial oxidation makes the lower amorphous silicon layer be crystallized to form a polysilicon layer having a small grain size which is not increased during a subsequent thermal process and having a uniform size.

Figure 1C:
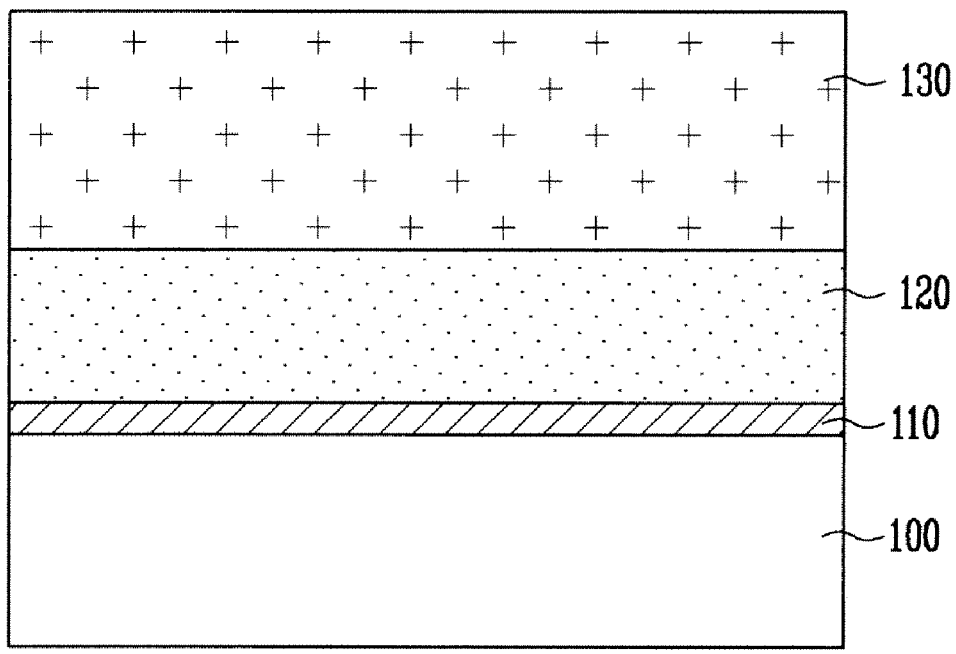

Referring to FIG. 1C, an upper amorphous silicon layer 130 is formed on the lower amorphous silicon layer 120. The upper amorphous silicon layer 130 acts as an upper layer of a gate electrode in the semiconductor device and acts as an upper layer of a floating gate in a flash memory device. A doped layer to which dopant is implanted for providing an electrical characteristic to the gate electrode is formed as the upper amorphous silicon layer.

A low pressure chemical vapor deposition (LPCVD) process is performed at a temperature of 500 to 650° C. and a pressure of 0.5 to 2.0 Torr and under an atmosphere of silane ($SiH_4$) gas and phosphine ($PH_3$) gas to form the upper amorphous silicon layer 130 as described above.

As described above, if a dual deposition process consisting of a deposition process for forming the lower amorphous silicon layer 120 and a deposition process for forming the upper amorphous silicon layer 130 is performed, it is possible to minimize an increase of Rs (sheet resistance) of the polysilicon layer caused by a partial oxidation of nitrous oxide ($N_2O$) gas.

Figure 1D:
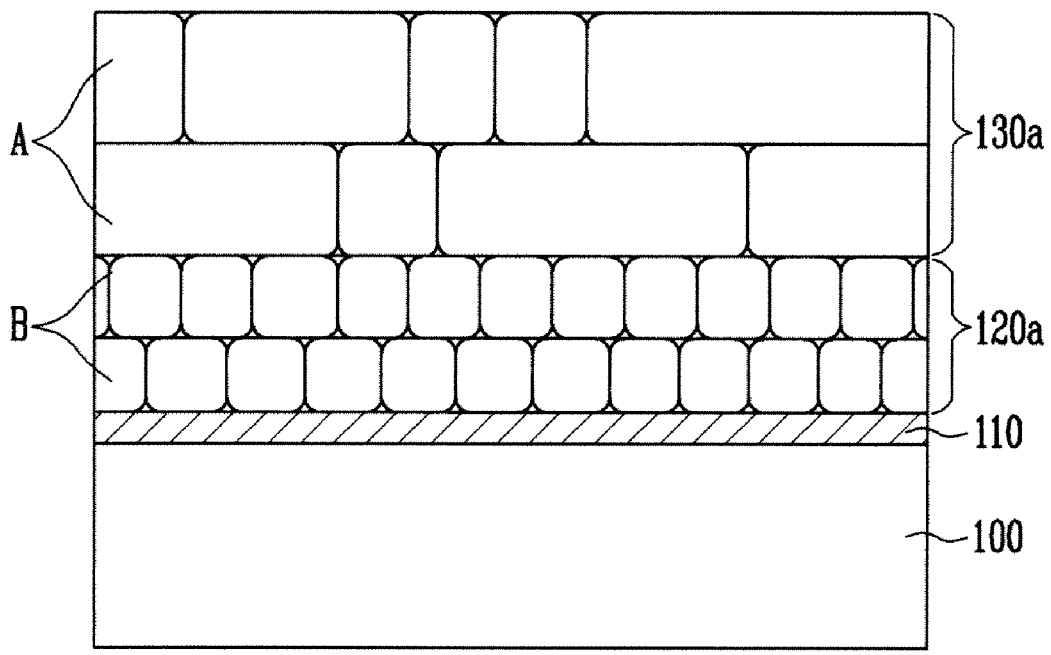

Referring to FIG. 1D, a subsequent high thermal process is performed. Here, the high thermal process includes all the processes performed at a temperature at which the amorphous silicon layer can be crystallized. The high thermal process may be a heat treatment process performed immediately after forming the upper amorphous silicon layer 130 or a process utilizing heat supplied for forming a thin layer, such as a dielectric layer (not shown) and the like, on the upper amorphous silicon layer 130 after forming the upper amorphous silicon layer. However, it is most preferable to perform the thermal process at a temperature optimized for crystallizing the lower amorphous silicon layer 120.

As a result, due to the above thermal process, the lower amorphous silicon layer 120 is crystallized to form a lower polysilicon layer 120a and the upper amorphous silicon layer 130 is crystallized to form an upper polysilicon layer 130a.

To put it concretely, the upper polysilicon layer 130a is a polysilicon layer which is ununiform and has a large grain size as indicated by "A" in FIG. 1D. On the contrary, due to a partial oxidation caused by nitrous oxide ($N_2O$) supplied at the time of forming the lower amorphous silicon layer 120, the lower polysilicon layer is crystallized to form a polysilicon layer having a grain size which is not increased and having a uniform size as indicated by "B" in FIG. 1D and having a size smaller than that of the upper polysilicon layer 130a.

A plurality of poly grains are contained in the lower polysilicon layer 120a and there is hardly a difference in the numbers of poly grains below the gate electrode between the gates when the gate electrode is formed, and so a boundary of the poly grains contained in respective gate is regularly distributed below the gate electrode at every gate. As a result, as described above, if the lower polysilicon layer 120a which is in contact with the gate insulating layer 110 is uniform and has a grain size which is smaller than that of the upper polysilicon layer 130a, a distribution of poly grain boundary below the gate electrode of each cell becomes uniform at the time of patterning the gate electrode in a subsequent process.

Accordingly, in a case where the dopant of the upper polysilicon layer 130a is diffused on the interface between the gate electrode and the gate insulating layer 110, a concentration of the dopant is uniformly distributed in the interface and so each gate can have a constant threshold voltage to improve a threshold voltage distribution characteristic between the gates.

In addition, although the gate insulating layer 110 is deteriorated, the gate insulating layer 110 is uniformly deteriorated due to the uniform distribution of the poly grain boundary. That is, the dopant is not concentrated on a specific portion of the gate insulating layer 110. As a result, it is possible to prevent the gate insulating layer 110 from being damaged and to maintain stably the data storage and retention.

In the meantime, in case a floating gate of a flash memory device is consisted of an upper layer having a large grain size like the upper polysilicon layer 130a and the lower layer having a small grain size like the lower polysilicon layer 120a, a distribution of the poly grain boundary of the lower layer of the floating gate becomes also uniform. Accordingly, if the dopant of the upper polysilicon layer is diffused to an interface between the floating gate and the tunnel insulating layer, a concentration of the dopant on the above interface becomes uniform, and so the respective cells can have a constant threshold voltage to improve a threshold voltage distribution characteristic between the cells.

In addition, although the tunnel insulating layer is deteriorated, the tunnel insulating layer is uniformly deteriorated due to the uniform distribution of the poly grain boundary. That is, the dopant is not concentrated on a specific portion of the tunnel insulating layer. As a result, it is possible to prevent the tunnel insulating layer from being damaged and to maintain stably the data storage and retention.

The present invention has the advantages as follows.

First, a partial oxidation of the amorphous silicon layer is generated by nitrous oxide ($N_2O$) gas utilized along with silane ($SiH_4$) gas for forming the amorphous silicon layer, so that it is possible to form the polysilicon layer having uniform and densed grain size in a subsequent thermal process.

Second, by forming the polysilicon layer having a uniform and densed grain size, the gate electrode in which a boundary of the poly grain being in contact with the gate insulating layer is uniformly distributed at the respective gates is formed. And so, a concentration of the dopant on the interface becomes uniform to improve the threshold voltage distribution characteristic between the gates.

Third, although the gate insulating layer 110 is deteriorated, the gate insulating layer 110 is uniformly deteriorated due to the uniform distribution of the poly grain boundary. That is, the dopant is not concentrated on a specific portion of the gate insulating layer 110. As a result, it is possible to prevent the gate insulating layer 110 from being damaged and to maintain stably the data storage and retention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of forming a gate electrode, comprising the steps of:
   forming a lower amorphous silicon layer on a gate insulating layer using silane ($SiH_4$) gas and nitrous oxide ($N_2O$) gas;
   forming an upper amorphous silicon layer on the lower amorphous silicon layer; and
   crystallizing the lower and upper amorphous silicon layers through a thermal process to form lower and upper polysilicon layers for the gate electrode,
   wherein a grain size of the lower polysilicon layer is smaller than a grain size of the upper polysilicon layer.

2. The method of forming the gate electrode of claim 1, wherein the lower polysilicon layer, which is crystallized by performing the thermal process, has a grain size that is more uniform and denser than the grain size of the upper polysilicon layer due to a partial oxidation of the lower amorphous silicon layer caused by nitrous oxide ($N_2O$) gas.

3. The method of forming the gate electrode of claim 1, wherein the lower amorphous silicon layer is formed through a lower pressure chemical vapor deposition process.

4. The method of forming the gate electrode of claim 3, wherein the lower pressure chemical vapor deposition process is performed at a temperature of 700° C. to 900° C. and a pressure of 0.5 Torr to 2.0 Torr.

5. The method of forming the gate electrode of claim 1, wherein the upper amorphous silicon layer is formed through a lower pressure chemical vapor deposition process.

6. The method of forming the gate electrode of claim 5, wherein the lower pressure chemical vapor deposition process is performed at a temperature of 500° C. to 650° C. and a pressure of 0.5 Torr to 2.0 Torr.

7. The method of forming the gate electrode of claim 5, wherein the lower pressure chemical vapor deposition process is performed under an atmosphere of silane ($SiH_4$) gas and phosphine ($PH_3$) gas.

8. A method of forming a gate electrode, comprising the steps of:
   forming a lower amorphous silicon layer on a gate insulating layer through a first low pressure chemical vapor deposition process using silane ($SiH_4$) gas and nitrous oxide ($N_2O$) gas;
   forming an upper amorphous silicon layer on the lower amorphous silicon layer through a second low pressure chemical vapor deposition process using silane ($SiH_4$) gas and phosphine ($PH_3$) gas; and
   crystallizing the lower and upper amorphous silicon layers through a thermal process to form lower and upper polysilicon layers for the gate electrode.

9. The method of forming the gate electrode of claim 8, wherein a grain size of the lower polysilicon layer is smaller than a grain size of the upper polysilicon layer.

10. The method of forming the gate electrode of claim 8, wherein the nitrous oxide ($N_2O$) gas generates a partial oxidation in the lower amorphous silicon layer.

11. The method of forming the gate electrode of claim 8, wherein the first lower pressure chemical vapor deposition process is performed at a temperature of 700° C. to 900° C. and a pressure of 0.5 Torr to 2.0 Torr.

12. The method of forming the gate electrode of claim 8, wherein the second lower pressure chemical vapor deposition process is performed at a temperature of 500° C. to 650° C. and a pressure of 0.5 Torr to 2.0 Torr.

* * * * *